United States Patent
Sumino et al.

(10) Patent No.: US 10,125,313 B2
(45) Date of Patent: *Nov. 13, 2018

(54) OXYNITRIDE PHOSPHOR POWDER AND METHOD FOR PRODUCING SAME

(71) Applicant: Ube Industries, Ltd., Ube-shi (JP)

(72) Inventors: Mao Sumino, Ube (JP); Takayuki Ueda, Ube (JP); Kazuki Iwashita, Ube (JP); Masataka Fujinaga, Ube (JP); Shinsuke Jida, Ube (JP)

(73) Assignee: Ube Industries, Ltd. (JP)

(*) Notice: Subject to any disclaimer, the term of this patent is extended or adjusted under 35 U.S.C. 154(b) by 181 days.

This patent is subject to a terminal disclaimer.

(21) Appl. No.: 15/115,943

(22) PCT Filed: Feb. 2, 2015

(86) PCT No.: PCT/JP2015/052821
§ 371 (c)(1),
(2) Date: Aug. 2, 2016

(87) PCT Pub. No.: WO2015/115640
PCT Pub. Date: Aug. 6, 2015

(65) Prior Publication Data
US 2017/0174986 A1    Jun. 22, 2017

(30) Foreign Application Priority Data
Feb. 3, 2014 (JP) ................... 2014-018760

(51) Int. Cl.
C09K 11/08 (2006.01)
C09K 11/55 (2006.01)
H01L 33/50 (2010.01)
C09K 11/77 (2006.01)

(52) U.S. Cl.
CPC ...... *C09K 11/7734* (2013.01); *C09K 11/0883* (2013.01); *C09K 11/55* (2013.01); *H01L 33/502* (2013.01)

(58) Field of Classification Search
CPC ............ C09K 11/0883; C09K 11/7734; H01L 33/502
See application file for complete search history.

(56) References Cited

U.S. PATENT DOCUMENTS

| | | | |
|---|---|---|---|
| 9,828,545 B2* | 11/2017 | Sumino | C01B 21/06 |
| 2003/0030038 A1 | 2/2003 | Mitomo et al. | |
| 2005/0012075 A1 | 1/2005 | Sakata et al. | |
| 2009/0284948 A1 | 11/2009 | Yamao et al. | |
| 2010/0072498 A1 | 3/2010 | Xie et al. | |
| 2010/0208481 A1 | 8/2010 | Miyake et al. | |
| 2011/0133629 A1 | 6/2011 | Sakata et al. | |
| 2012/0019127 A1 | 1/2012 | Hirosaki | |
| 2012/0319566 A1 | 12/2012 | Sakata et al. | |
| 2014/0264170 A1 | 9/2014 | Fujinaga et al. | |
| 2016/0060516 A1 | 3/2016 | Sumino et al. | |
| 2016/0272886 A1* | 9/2016 | Ueda | C09K 11/0883 |

FOREIGN PATENT DOCUMENTS

| | | |
|---|---|---|
| EP | 2 977 426 | 1/2016 |
| JP | 2002-363554 A | 12/2002 |
| JP | 2005-008794 A | 1/2005 |
| JP | 2005-36038 A | 2/2005 |
| JP | 2009-096882 A | 5/2009 |
| JP | 2009-96883 A | 5/2009 |
| JP | WO 2014/148571 * | 9/2014 |
| JP | WO 2014/157695 * | 10/2014 |
| TW | 201335337 A1 | 9/2013 |
| WO | 2006/118321 A1 | 11/2006 |
| WO | 2008/004640 A1 | 1/2008 |
| WO | 2010/018873 A1 | 2/2010 |
| WO | 2010/110457 A1 | 9/2010 |
| WO | 2011/108740 A1 | 9/2011 |
| WO | 2014/157695 A1 | 10/2014 |

* cited by examiner

*Primary Examiner* — C Melissa Koslow
(74) *Attorney, Agent, or Firm* — DLA Piper LLP (US)

(57) ABSTRACT

An oxynitride phosphor powder has a fluorescence peak wavelength of 587 to 630 nm and a high external quantum efficiency. A method of producing the oxynitride phosphor powder containing Li at 50 to 10,000 ppm includes mixing silicon nitride powder, a substance serving as an aluminum source, a substance serving as a calcium source and a substance serving as an europium source; firing the mixture at 1500 to 2000° C. in an inert gas atmosphere or a reducing gas atmosphere to obtain a fired oxynitride phosphor composed mainly of Ca-containing α-SiAlON, as an intermediate; and heat treating the fired oxynitride phosphor at a temperature of 1450° C. to less than the firing temperature, in an inert gas atmosphere or in a reducing gas atmosphere in the presence of Li.

16 Claims, 1 Drawing Sheet

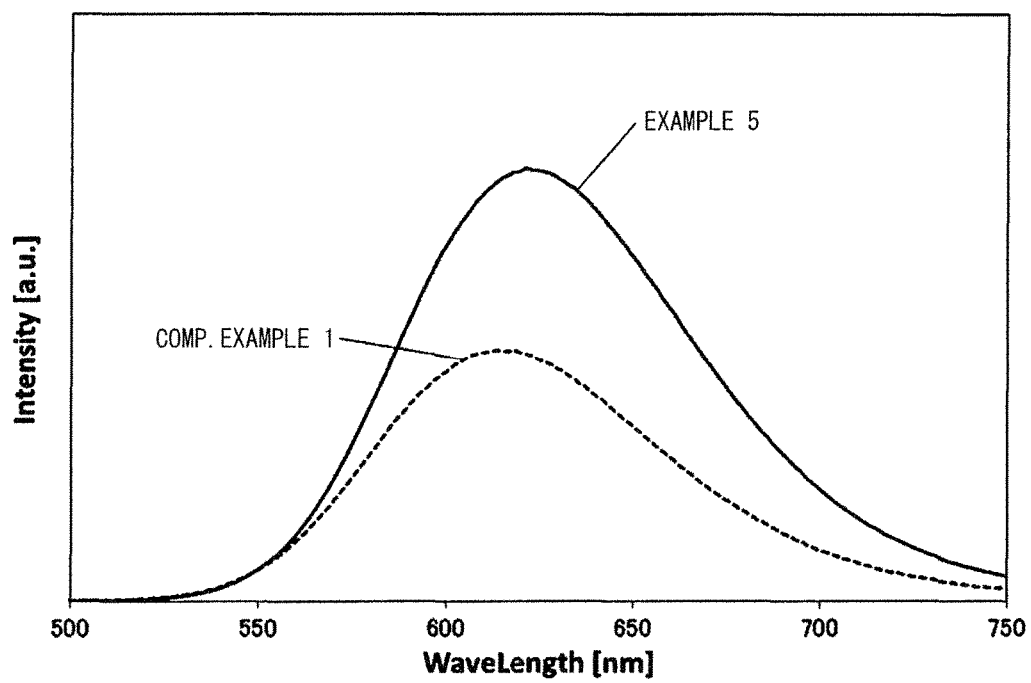

OXYNITRIDE PHOSPHOR POWDER AND METHOD FOR PRODUCING SAME

TECHNICAL FIELD

The present invention relates to an oxynitride phosphor powder containing, as a main component, Ca-containing α-SiAlON activated with a rare earth metal element, which is suitable for an ultraviolet to blue light source, and to a method for producing the same. More specifically, the invention relates to an oxynitride phosphor powder having a fluorescence peak wavelength in the range of 587 to 630 nm and exhibiting practical external quantum efficiency and fluorescence intensity, as well as to a method for producing it.

BACKGROUND ART

With the practical implementation of blue light-emitting diodes (LED) in recent years, white LEDs that utilize blue LEDs are also being actively developed. White LEDs have low power consumption and extended usable life compared to existing white light sources, for which reason efforts continue to progress toward their deployment in liquid crystal panel backlights, indoor and outdoor lighting devices, and the like.

The white LEDs presently being developed are obtained by applying Ce-doped YAG (yttrium-aluminum-garnet) onto the surfaces of blue LEDs. However, the fluorescence peak wavelength of Ce-doped YAG is around 560 nm, and when this fluorescence color and the light of blue LED are mixed to produce white light, the resulting white light is slightly blue-tinted, such that these types of white LEDs have had poor color rendering properties.

Numerous oxynitride phosphors are being studied in order to deal with this issue, and in particular, Eu-activated α-SiAlON phosphors are known to emit (yellow to orange) fluorescence with a peak wavelength of around 580 nm that is longer than the fluorescence peak wavelength of Ce-doped YAG (see PTL 1), and when a white LED is fabricated by using the α-SiAlON phosphor or by combining it with a Ce-doped YAG phosphor, it is possible to produce a white LED that exhibits a bulb color with a lower color temperature than a white LED using only Ce-doped YAG.

However, for a Ca-containing α-SiAlON phosphor activated by Eu, represented by the general formula:

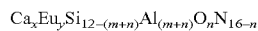
$Ca_xEu_ySi_{12-(m+n)}Al_{(m+n)}O_nN_{16-n}$ no high luminance phosphor has yet been developed that has practical value.

PTL 2 discloses a phosphor exhibiting excellent luminous efficiency and having a fluorescence peak at a wavelength of 595 nm or longer, and a method for producing it, wherein smooth-surface particles having sizes greater than in the prior art are obtained by adding previously synthesized α-SiAlON powder as seed crystals for grain growth to a starting powder, and powder having a specific particle size is obtained from the synthesized powder without conducting pulverizing treatment.

Specifically, there is disclosed an α-SiAlON phosphor which is an α-SiAlON phosphor having the composition $(Ca_{1.67}, Eu_{0.08})(Si, Al)_{12}(O, N)_{16}$ (x+y=1.75, O/N=0.03), the peak wavelength of the fluorescence spectrum obtained upon excitation with blue light of 455 nm being in the range of 599 to 601 nm and the luminous efficiency (=external quantum efficiency=absorptivity×internal quantum efficiency) is from 61 to 63%.

However, the PTL 2 does not give a specific example of a phosphor having a fluorescence peak wavelength of smaller than 599 nm or larger than 601 nm and exhibiting practicable luminous efficiency.

PTL 3 discloses a light-emitting device characterized by using a phosphor containing α-SiAlON as a main component, represented by the general formula: $(Ca_\alpha, Eu_\beta)(Si, Al)_{12}(O, N)_{16}$ (provided that $1.5<\alpha+\beta<2.2$, $0<\beta<0.2$, $O/N\leq0.04$) and having a specific surface area of 0.1 to 0.35 $m^2/g$, as well as a vehicle lighting device and a headlamp using the same.

PTL 3 discloses examples of an α-SiAlON phosphor, where the peak wavelengths of the fluorescence spectra obtained upon excitation with blue light of 455 nm are 592, 598 and 600 nm, and the luminous efficiencies (=external quantum efficiencies) are 61.0, 62.7, and 63.2%, respectively.

However, PTL 3 does not give a specific example of a phosphor having a fluorescence peak wavelength of smaller than 592 nm or larger than 600 nm and exhibiting practicable luminous efficiency.

PTL 4 discloses a SiAlON phosphor having a unique property of emitting light with high luminance compared to conventional phosphors, and a method for producing it, wherein a metal compound mixture capable of composing a SiAlON phosphor by firing is fired in a gas at a specific pressure in a specific temperature range, pulverized and classified to a specific particle size, and further heat treated.

However, what is specifically disclosed in PTL 4 is only the peak luminous intensity, and since the peak luminous intensity varies depending on the measuring apparatus and measurement conditions, it is not clear whether a practical level of luminous intensity is obtained.

PTL 5 discloses Li-containing α-SiAlON phosphor particles and a method for producing it, the method comprising: mixing a silicon nitride or nitrogen-containing silicon compound powder, an AlN-containing aluminum source, a Li source and a Eu source; firing the mixture at 1500 to 1800° C. in an inert gas atmosphere containing nitrogen at ordinary pressure, or in a reducing gas atmosphere, to obtain a lithium-containing α-SiAlON powder as a starting material; adding and mixing additional lithium source to the powder; and refiring either at a lower temperature than the firing temperature or at 1100° C. or higher and less than 1600° C., in an inert gas atmosphere containing nitrogen or in a reducing gas atmosphere at ordinary pressure.

However, what is specifically disclosed in PTL 5 is Li-containing α-SiAlON phosphor particles with a peak wavelength of 572 to 588 nm, while no specific examples are provided of phosphors with a fluorescence peak wavelength of greater than 588 nm, and only the peak luminous intensity is disclosed without specific quantum efficiencies, such that it is not clear whether the luminous efficiency is of a practical level.

PTL 6 describes an α-SiAlON phosphor represented by the general formula: $Li_xCa_yEu_zSi_{12-(m+n)}Al_{(m+n)}O_nN_{16-n}$ (x being such that $0<x\leq0.8$, and $0.3\leq m<4.5$, $0<n<2.25$).

However, what is specifically disclosed in PTL 6 is (Ca, Li)-containing α-SiAlON phosphor particles with a peak wavelength of near 560 nm, whereas no phosphor with a fluorescence peak wavelength of greater than 590 nm is mentioned and the specific quantum efficiencies are not provided, such that it is not clear whether the luminous efficiency is of a practical level.

CITATION LIST

Patent Literature

[PTL 1] Japanese Unexamined Patent Publication No. 2002-363554
[PTL 2] Japanese Unexamined Patent Publication No. 2009-96882
[PTL 3] Japanese Unexamined Patent Publication No. 2009-96883
[PTL 4] Japanese Unexamined Patent Publication No. 2005-008794
[PTL 5] WO2011/108740
[PTL 6] Japanese Unexamined Patent Publication No. 2005-036038

SUMMARY OF THE INVENTION

Problems to be Solved by the Invention

With the goal of modifying the color temperature of white LEDs and obtaining yellow to orange luminescence of desired wavelengths, there is a demand for a phosphor with high luminance of a practical level. However, as mentioned above, no Ca-containing α-SiAlON phosphor is known that has a practical level of high efficiency for a broad luminescent peak wavelength range with a fluorescence peak wavelength of 587 to 630 nm, and particularly a luminous wavelength range of 605 to 630 nm, that has not been achievable with conventional orange to red phosphors.

It is an object of the present invention to provide an oxynitride phosphor having a fluorescence peak wavelength of 587 to 630 nm, the oxynitride phosphor having higher external quantum efficiency than the prior art.

Means for Solving the Problems

As a result of much diligent research directed toward solving the problem described above, the present inventors have accomplished this invention upon finding that an oxynitride phosphor powder emitting fluorescence in a broad wavelength range with a peak wavelength of 587 nm to 630 nm and particularly high external quantum efficiency therein, can be obtained by mixing silicon nitride powder, a substance serving as an aluminum source, a substance serving as a calcium source and a substance serving as an europium source, firing the mixture at 1500 to 2000° C. in an inert gas atmosphere or in a reducing gas atmosphere to obtain a fired oxynitride phosphor composed mainly of Ca-containing α-SiAlON, as an intermediate, and heat treating the fired oxynitride phosphor at a temperature of from 1450° C. to less than the firing temperature, in an inert gas atmosphere or in a reducing gas atmosphere under conditions in the presence of Li, so that the product contains Li at 50 to 10,000 ppm.

The invention further relates to an oxynitride phosphor powder obtained by mixing silicon nitride powder, a substance serving as an aluminum source, a substance serving as a calcium source and a substance serving as an europium source, firing the mixture in a temperature range of 1500 to 2000° C. in an inert gas atmosphere or in a reducing gas atmosphere to obtain a fired oxynitride phosphor composed mainly of Ca-containing α-SiAlON, as an intermediate, and heat treating the fired oxynitride phosphor at a temperature of from 1450° C. to less than the firing temperature, in an inert gas atmosphere or in a reducing gas atmosphere under conditions in the presence of Li, the powder containing Li at 50 to 10,000 ppm and having a surface Li content of 50% or greater.

The present invention further relates to an oxynitride phosphor powder comprising Ca-containing α-SiAlON and aluminum nitride, and further containing Li at 50 to 10,000 ppm and having a surface Li content of 50% or greater.

In particular, the invention relates to the aforementioned oxynitride phosphor powder wherein the compositional formula for the Ca-containing α-SiAlON and aluminum nitride is represented as follows:

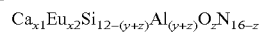

$Ca_{x1}Eu_{x2}Si_{12-(y+z)}Al_{(y+z)}O_zN_{16-z}$ (wherein $1.11 \leq x1+x2 \leq 3.34$, $0.01 \leq x2/x1 \leq 1.50$, $2.4 \leq y \leq 7.3$ and $0 \leq z \leq 1.5$, and preferably $1.60 \leq x1+x2 \leq 3.00$, $0.10 \leq x2/x1 \leq 1.20$, $4.0 \leq y \leq 7.0$ and $0 \leq z \leq 0.5$).

The present invention still further relates to the aforementioned oxynitride phosphor powder wherein the aluminum nitride content is in the range of greater than 0 mass % and less than 36 mass %, the phosphor containing Li at 50 to 10,000 ppm.

The present invention still further relates to the aforementioned oxynitride phosphor powder wherein excitation with light having a wavelength of 450 nm causes emission of fluorescence with a peak wavelength in a wavelength range of from 587 nm to 630 nm and preferably a wavelength range of from 605 nm to 630 nm, the external quantum efficiency thereof being 44% or greater and preferably 50% or greater.

The invention still further relates to an oxynitride phosphor powder obtained by mixing silicon nitride powder, a substance serving as an aluminum source, a substance serving as a calcium source and a substance serving as an europium source, firing the mixture at 1500 to 2000° C. in an inert gas atmosphere or in a reducing gas atmosphere to obtain a fired oxynitride phosphor including Ca-containing α-SiAlON and aluminum nitride, as an intermediate, and heat treating the fired oxynitride phosphor at a temperature of from 1450° C. to less than the firing temperature, in an inert gas atmosphere or in a reducing gas atmosphere under conditions in the presence of Li, the powder containing Li at 50 to 10,000 ppm and having a surface Li content of 50% or greater.

The invention still further relates to a light-emitting device that uses the oxynitride phosphor powder.

Effect of the Invention

According to the invention there is provided a high efficiency oxynitride phosphor powder emitting fluorescence in a broad wavelength range with a peak wavelength between 587 nm and 630 nm and particularly high external quantum efficiency therein, by mixing silicon nitride powder, a substance serving as an aluminum source, a substance serving as a calcium source and a substance serving as an europium source, firing the mixture at 1500 to 2000° C. in an inert gas atmosphere or in a reducing gas atmosphere to obtain a fired oxynitride phosphor composed mainly of Ca-containing α-SiAlON, as an intermediate, and heat treating the fired oxynitride phosphor at a temperature of from 1450° C. to less than the firing temperature, in an inert gas atmosphere or in a reducing gas atmosphere under conditions in which Li is present.

BRIEF DESCRIPTION OF THE DRAWINGS

FIG. 1 is a graph showing the fluorescence spectra for Example 5 and Comparative Example 1.

DESCRIPTION OF EMBODIMENTS

The invention will now be explained in greater detail.

It relates to a method for producing an oxynitride phosphor powder whereby an oxynitride phosphor powder emitting fluorescence in a broad wavelength range with a peak wavelength between 587 nm and 630 nm and particularly high external quantum efficiency therein, can be obtained by mixing silicon nitride powder, a substance serving as an aluminum source, a substance serving as a calcium source and a substance serving as an europium source, firing the mixture in a temperature range of 1500 to 2000° C. in an inert gas atmosphere or in a reducing gas atmosphere to obtain a fired oxynitride phosphor composed mainly of Ca-containing α-SiAlON, as an intermediate, and heat treating the fired oxynitride phosphor in a temperature range from 1450° C. to less than the firing temperature, in an inert gas atmosphere or in a reducing gas atmosphere under conditions in which Li is present.

In particular, according to the invention, it is possible to obtain an oxynitride phosphor powder composed mainly of Ca-containing α-SiAlON and including Li at 50 to 10,000 ppm that, upon excitation with light having a wavelength of 450 nm, emits fluorescence in a broad wavelength range with a peak wavelength of from 587 nm to 630 nm, with particularly high external quantum efficiency therein.

The lower limit for the peak wavelength is 587 nm or greater and preferably 605 nm or greater. The upper limit for the peak wavelength is no greater than 630 nm, for example, no greater than 629 nm or no greater than 626 nm.

The compound α-SiAlON, and especially Ca-containing α-SiAlON, is a solid solution in which some of the Si—N bonds of α-silicon nitride are replaced by Al—N bonds and Al—O bonds, with Ca ions infiltrating the lattice in solid solution so that electrical neutrality is maintained.

The α-SiAlON phosphor in the oxynitride phosphor of the invention, having Eu ion infiltrating in solid solution in the lattice in addition to Ca ion, is a phosphor represented by the general formula shown above, in which the Ca-containing α-SiAlON is activated and excitation by blue light causes emission of yellow to orange fluorescence.

Common α-SiAlON phosphors with activated rare earth elements, as described in PTL 1, are represented by $MeSi_{12-(m+n)}Al_{(m+n)}O_nN_{16-n}$ (where Me represents Ca, Mg, Y or one or more species of lanthanide metals other than La and Ce), the metal Me being in solid solution from a minimum of 1 atom per 3 unit cells to a maximum of 1 atom per 1 unit cell of α-SiAlON containing 4 formula of $(Si,Al)_3(N, O)_4$. The solid solubility limit in the aforementioned general formula, for a divalent metal element Me, is generally $0.6<m<3.0$ and $0 \leq n<1.5$, and for a trivalent metal Me is $0.9<m<4.5$ and $0 \leq n<1.5$. An α-SiAlON single phase does not result outside of these ranges. Consequently, studies of α-SiAlON phosphors to date have been limited to these compositional ranges.

The present inventors have found, as a result of diligent research on the compositional range in which an α-SiAlON single phase is generally obtained, and even outside of the compositional range in which an α-SiAlON single phase is obtained, that drastically increased luminous efficiency is achieved by heat treatment under conditions with a prescribed amount of Li present. In addition, it was found that, compared to a phosphor within the compositional range in which an α-SiAlON single phase is obtained, it is possible to obtain a luminescence peak at longer wavelength, and to increase the luminous efficiency, in the compositional range in which an α-SiAlON single phase is not obtained.

The oxynitride phosphor powder of the invention will now be explained in detail.

The oxynitride phosphor powder of the invention is an oxynitride phosphor powder containing Li at 50 to 10,000 ppm, and composed mainly of Ca-containing α-SiAlON. According to the invention, if the Li content is less than 50 ppm or the Li content is greater than 10,000 ppm in the oxynitride phosphor powder, the external quantum efficiency falls to less than 44%. Also according to the invention, the Li content in the oxynitride phosphor powder is preferably 100 ppm or greater, more preferably 200 ppm or greater and even more preferably 240 ppm or greater. Furthermore, the Li content in the oxynitride phosphor powder is preferably no greater than 8000 ppm, more preferably no greater than 5000 ppm, even more preferably no greater than 2000 ppm and yet more preferably no greater than 1000 ppm. For example, the Li content may be in the range of 100 to 5000 ppm. If the Li content is within the above range, it will be easier to further increase the external quantum efficiency.

The external quantum efficiency is 44% or greater and preferably 50% or greater.

The Li content of the oxynitride phosphor powder (total Li content) can be quantitatively analyzed using an inductively coupled plasma atomic emission spectrometer (ICP-AES). The Li content can be determined by conducting thermolysis of the oxynitride phosphor powder with phosphoric acid, perchloric acid, nitric acid and hydrofluoric acid, forming a constant volume with purified water, and conducting quantitative analysis by ICP-AES.

According to the invention, after the fired oxynitride phosphor composed mainly of Ca-containing α-SiAlON has been prepared, heat treatment is carried out under conditions in which Li is present, and therefore the Li is present near the surface of the oxynitride phosphor powder. In other words, Li is virtually absent in the crystal lattice of the oxynitride phosphor that is composed mainly of Ca-containing α-SiAlON, while being abundantly present on the particle surfaces.

Throughout the present specification, the amount of Li present inside the oxynitride phosphor powder will be referred to as the "intraparticle Li content", and the amount of Li present near the particle surfaces will be referred to as the "surface Li content". The surface Li content can be determined in the following manner. For oxynitride phosphor powder, acid treatment may be conducted by 5 hours of immersion in 1N nitric acid (1N nitric acid in 50-fold amount by mass with respect to phosphor powder) at 20° C., filtration and purified water rinsing, to remove the surface layer of the oxynitride phosphor, and then the surface layer-removed phosphor may be subjected to the aforementioned ICP-AES quantitative analysis for measurement of the intraparticle Li content. Based on the difference from the aforementioned total Li content, the proportion of the surface Li content can be calculated using formula (1).

$$((\text{Total Li content}-\text{intraparticle Li content})/\text{total Li content}) \times 100 \quad \text{formula (1)}$$

Thus, the value calculated by formula (1) is defined as the surface Li content.

The surface Li content is 50% or greater and preferably 60% or greater of the Li content in the phosphor powder. According to the invention, when the surface Li content is less than 50% the luminescence peak wavelength is reduced and the external quantum efficiency is less than 44%. While it is not our intention to be constrained by theory, it is possible that the Li added by heat treatment is present primarily in the oxygen-rich amorphous layer on the particle surfaces of the oxynitride phosphor composed mainly of Ca-containing α-SiAlON. The oxygen-rich amorphous layer with abundant Li present that has been added by heat treatment is easily etched by acid treatment, and etching is hard to proceed inside the highly crystalline oxynitride phosphor powder. When the amount (depth) of etching is calculated based on the change in weight before and after acid treatment, assuming spherical particles for the oxynitride phosphor powder, the etching depth is about 1 to 10 nm, and the etching depth is thought to correspond to the thickness of the oxygen-rich amorphous layer in which the Li added by heat treatment is abundantly present.

In particular, the oxynitride phosphor powder of the invention is preferably oxynitride phosphor powder containing Li at 50 to 10,000 ppm and comprising Ca-containing α-SiAlON and aluminum nitride. When the oxynitride phosphor powder includes Ca-containing α-SiAlON and aluminum nitride, it is possible to obtain high external quantum efficiency in a broad wavelength range with a luminescence peak wavelength of 587 nm to 630 nm, and especially to obtain high external quantum efficiency in a wavelength range of greater than 605 nm.

According to the invention, more preferably, the compositional formula for the Ca-containing α-SiAlON and aluminum nitride is represented as: $Ca_{x1}Eu_{x2}Si_{12-(y+z)}Al_{(y+z)}O_zN_{16-z}$, (wherein $1.11 \leq x1+x2 \leq 3.34$, $0.01 \leq x2/x1 \leq 1.50$, $2.4 \leq y \leq 7.3$ and $0 \leq z \leq 1.5$, and preferably $1.60 \leq x1+x2 \leq 3.00$, $0.10 \leq x2/x1 \leq 1.20$, $4.0 \leq y \leq 7.0$ and $0 \leq z \leq 0.5$), and the oxynitride phosphor powder of the invention is an oxynitride phosphor further containing Li at 50 to 10,000 ppm in the compositional formula.

x1 and x2 are values representing the infiltrated solid solution amounts of Ca ion and Eu ion in the SiAlON. If x1+x2 is smaller than 1.60 the luminous wavelength will be smaller than 605 nm, while if x1+x2 is larger than 3.00 the external quantum efficiency will be lower than 50%, and therefore x1+x2 is preferably between 1.60 and 3.00, inclusive. Moreover, if x2/x1 is smaller than 0.10 the luminous wavelength will be smaller than 605 nm, and if it is larger than 1.20, the external quantum efficiency will be lower than 50%, and therefore x2/x1 is preferably between 0.10 and 1.20, inclusive.

The range for the value of x1+x2 is more preferably $1.60 \leq x1+x2 < 2.93$ and even more preferably $1.60 \leq x1+x2 \leq 2.90$.

The range for the value of x2/x1 is more preferably $0.10 \leq x2/x1 < 1.15$ and even more preferably $0.10 \leq x2/x1 \leq 0.95$.

The value of y is set so as to maintain electrical neutrality when the metal elements are in solid solution in the SiAlON, and is represented by y=2x1+3x2 for the oxynitride phosphor powder. In the formula, the coefficient 2 for x1 is the numerical value of the valency of the Ca ion in solid solution in the Ca-containing α-SiAlON phosphor, and the coefficient 3 for x2 in the formula is the numerical value of the valency of the Eu ion in solid solution in the Ca-containing α-SiAlON phosphor. Since α-SiAlON and aluminum nitride are included in the oxynitride phosphor of the invention, y is a value relating to the amount of aluminum nitride produced. In other words, when the y value exceeds the compositional range in which an α-SiAlON single phase is obtained, aluminum nitride and other aluminum-containing oxynitrides are produced.

According to the invention, the range for y is preferably $4.0 \leq y \leq 7.0$. If y is greater than 7.0, the amount of aluminum nitride crystal phase produced will increase, and the external quantum efficiency will be lower than 50%. If y is smaller than 4.0, the luminescence peak wavelength will be less than 605 nm. Therefore, y is preferably between 4.0 and 7.0, inclusive. The range for the value of y is more preferably $4.0 \leq y < 7.0$, even more preferably $4.0 \leq y \leq 6.0$, yet more preferably $4.6 \leq y \leq 7.0$ and even yet more preferably $4.6 \leq y \leq 6.0$.

Also, z is a value related to the oxygen substituted solid solution amount in α-SiAlON. The range of z is preferably $0.0 \leq z \leq 1.1$, more preferably $0.0 \leq z \leq 1.1$ and even more preferably $0.0 \leq z \leq 0.5$. If z is 0.5 or smaller, it will be possible to obtain a luminescence peak wavelength of 605 nm or greater. Particularly with a composition wherein y and z are such that $4.0 \leq y \leq 7.0$ and $0.0 \leq z \leq 0.5$, a high efficiency oxynitride phosphor powder is provided, having a luminous wavelength of 605 to 630 nm and a more practical external quantum efficiency. Also, in the ranges of $0 \leq y < 1.0$ and $0 \leq z < 1.5$, β-SiAlON is produced and the external quantum efficiency is reduced.

More preferably according to the invention, the ranges of x1+x2, x2/x1, y and z are so that $1.60 \leq x1+x2 \leq 2.80$, $0.10 \leq x2/x1 \leq 0.95$, $4.0 \leq y \leq 6.5$ and $0.0 \leq z \leq 0.5$, and the Li content is 100 to 5000 ppm. With a composition in which x1+x2, x2/x1, y, z and the Li content within the above ranges, a high efficiency oxynitride phosphor powder having a luminescence peak wavelength of 605 nm or greater and greater external quantum efficiency is provided.

When the crystal phase is identified with a X-ray diffraction (XRD) apparatus using CuKα rays, the oxynitride phosphor powder of the invention is found to comprise an α-SiAlON crystal phase classified as trigonal, and an aluminum nitride crystal phase classified as hexagonal. When the oxynitride phosphor powder is a single phase which is an α-SiAlON crystal phase, the luminescence peak wavelength is reduced, and if the aluminum nitride crystal phase is too abundant the external quantum efficiency is reduced. The content of the aluminum nitride crystal phase in the oxynitride phosphor powder is preferably in the range of greater than 0 wt % and less than 36 wt %. If the aluminum nitride crystal phase is included within the above range, the external quantum efficiency will be increased.

Identification of the crystal phase and quantification of the crystal phase by XRD measurement may be conducted using X-ray pattern analysis software. The analysis software may be PDXL by Rigaku Corp., or similar software. XRD measurement of the oxynitride phosphor powder and quantification of the crystal phase by the Rietveld method were carried out using an X-ray diffraction device (Ultima IV Protectus) and analysis software (PDXL) by Rigaku Corp.

According to the invention, the content of the aluminum nitride crystal phase in the oxynitride phosphor powder is preferably in the range of greater than 0 wt % and no greater than 38 wt %. The lower limit for the content of the aluminum nitride crystal phase is more preferably 2 wt % or greater and even more preferably 3 wt % or greater. The upper limit for the content of the aluminum nitride crystal phase is more preferably no greater than 36 wt % and even more preferably no greater than 33 wt %. When the oxynitride phosphor powder is a single phase which is an α-SiAlON crystal phase, the luminescence peak wavelength is smaller than 605 nm, and when the aluminum nitride crystal phase is greater than 36 wt %, the external quantum efficiency is reduced.

In order to suitably use the oxynitride phosphor powder of the invention as a phosphor for a white LED, preferably the $D_{50}$, which is the 50% median in the particle size distribution curve, is 10.0 to 20.0 μm and the specific surface area is 0.2 to 0.6 m$^2$/g. This is because when $D_{50}$ is smaller than 10.0 μm and the specific surface area is larger than 0.6 m²/g, the luminous intensity may be reduced, and when $D_{50}$ is larger than 20.0 μm and the specific surface area is smaller than 0.2 m²/g, it may become difficult to achieve uniform dispersion in the resin that seals the phosphor, potentially resulting in variation in the color tone of the white LED.

The method for controlling the particle size and specific surface area of the oxynitride phosphor powder of the invention may be control of the particle size of the starting silicon nitride powder. Silicon nitride powder having a mean particle size ($D_{50}$) of 1.5 μm or greater is preferably used, since the $D_{50}$ of the oxynitride phosphor powder will be 10 μm or greater, the specific surface area will be 0.2 to 0.6 m²/g, and the external quantum efficiency will be higher.

The $D_{50}$ of the oxynitride phosphor powder is the 50% diameter in the particle size distribution curve, measured using a laser diffraction/scattering particle size distribution analyzer. The specific surface area of the oxynitride phosphor powder was measured with a Flow Sorb 2300 specific surface area measuring apparatus (BET method based on nitrogen gas adsorption), by Shimadzu Corp.

The oxynitride phosphor powder of the invention, upon excitation with light in the wavelength region of 450 nm, can emit fluorescence with a peak wavelength in a wavelength range of from 587 nm to 630 nm and preferably a wavelength range of from 605 nm to 630 nm, the external quantum efficiency thereof being 44% or greater and preferably 50% or greater. As a result, with the oxynitride phosphor powder of the invention it is possible to efficiently obtain long-wavelength orange fluorescence by blue excitation light, and by combination with the blue light used as the excitation light, it is possible to efficiently obtain white light with satisfactory color rendering.

The fluorescence peak wavelength may be measured with a solid quantum efficiency measuring device incorporating an integrating sphere in an FP6500 by JASCO Corp. Fluorescence spectrum compensation can be conducted with a substandard light source, but the fluorescence peak wavelength will show some variation depending on the measuring device and compensation conditions used.

The external quantum efficiency may also be calculated from the product of the absorptivity and the internal quantum efficiency, measured using a solid quantum efficiency measuring device incorporating an integrating sphere in an FP6500 by JASCO Corp.

The oxynitride phosphor powder of the invention may be combined with a light-emitting source, such as a known light emitting diode, for use as a light-emitting element in different types of lighting fixtures.

A light-emitting source with an excitation light peak wavelength in the range of 330 to 500 nm is particularly suitable for the oxynitride phosphor powder of the invention. In the ultraviolet range, the luminous efficiency of oxynitride phosphor powder is high and a light-emitting element with satisfactory performance can be constructed. Even with a blue light source, the luminous efficiency is high, and it is possible to combine the yellow to orange fluorescence of the oxynitride phosphor powder of the invention with the blue excitation light to construct a light-emitting element with satisfactory daylight white to daylight color.

A method for producing the oxynitride phosphor powder of the invention will now be explained in detail.

The oxynitride phosphor powder of the invention can be produced by mixing silicon nitride powder, a substance serving as an aluminum source, a substance serving as a calcium source and a substance serving as an europium source, so that in the compositional formula:

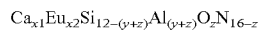

$$Ca_{x1}Eu_{x2}Si_{12-(y+z)}Al_{(y+z)}O_zN_{16-z}$$

the composition is such that $1.11 \leq x1+x2 \leq 3.34$, $0.01 \leq x2/x1 \leq 1.50$, $2.4 \leq y \leq 7.3$, and $0 \leq z \leq 1.5$, and preferably $1.60 \leq x1+x2 \leq 3.00$, $0.10 \leq x2/x1 \leq 1.20$, $4.0 \leq y \leq 7.0$, and $0 \leq z \leq 0.5$, and firing the mixture in an inert gas atmosphere or in a reducing gas atmosphere in a temperature range of 1500 to 2000° C., to obtain a fired oxynitride phosphor including Ca-containing α-SiAlON and aluminum nitride as an intermediate, and then heat treating the obtained fired product at a temperature from 1450° C. to less than the aforementioned firing temperature, in an inert gas atmosphere or in a reducing gas atmosphere, under conditions in which Li is present.

The starting silicon nitride powder is more preferably crystalline silicon nitride. By using crystalline silicon nitride it is possible to obtain an oxynitride phosphor with high external quantum efficiency.

The material for the starting aluminum source may be aluminum nitride, aluminum oxide or aluminum metal, any of which powders may be used alone or in combination.

The material for the starting calcium source is selected from among calcium nitrides, oxynitrides, oxides, or precursor substances that are converted to oxides by thermal decomposition.

The material for the starting europium source is selected from among europium nitrides, oxynitrides, oxides, or precursor substances that are converted to oxides by thermal decomposition.

For the firing, it is preferred to add a Li-containing compound as a sintering aid, in order to promote sintering and produce an α-SiAlON crystal phase at lower temperature. The Li-containing compound used may be lithium oxide, lithium carbonate, lithium metal or lithium nitride, and any one of these powders may be used alone or they may be used in combination. The amount of Li-containing compound added is suitably 0.01 to 0.5 mol as Li element with respect to 1 mol of the fired oxynitride. The Li-containing compound added during firing undergoes thermolysis, and the Li decomposition product produced readily melts and vaporizes, being virtually absent from the fired oxynitride that is produced.

There are no particular restrictions on the method of mixing the silicon nitride powder, the substance serving as an aluminum source, the substance serving as a calcium source and the substance serving as an europium source, and it may be a method that is publicly known such as, for example, a method of dry blending, or a method of wet blending the starting components in an inactive solvent which is substantially unreactive with the starting components and then removing the solvent. The mixer used is preferably a V-shaped mixer, rocking mixer, ball mill, vibrating mill, media agitating mill or the like.

The mixture of the silicon nitride powder, the substance serving as an aluminum source, the substance serving as a calcium source and the substance serving as an europium source may be fired in an inert gas atmosphere or in a reducing gas atmosphere, in a temperature range of 1500 to 2000° C., to obtain a fired oxynitride represented by the compositional formula given above. A temperature of lower than 1500° C. will require heating for a long time to produce α-SiAlON, and is not practical. A temperature of higher than 2000° C. will cause sublimation decomposition of the silicon nitride and α-SiAlON and production of free silicon, making it impossible to obtain oxynitride phosphor powder with high external quantum efficiency. There is no particular restriction on the heating furnace used for firing, so long as it allows firing in an inert gas atmosphere or in a reducing gas atmosphere in a temperature range of 1500 to 2000° C. For example, a batch electric furnace employing a high-frequency induction heating system or a resistance heating system, or a rotary kiln, or a fluidized bed kiln, or a pusher electric furnace, or the like, may be used. As the crucible in which the mixture is to be filled there may be used a BN crucible, silicon nitride crucible, graphite crucible or silicon carbide crucible. The fired oxynitride obtained by firing is a powder with low aggregation and satisfactory dispersibility.

The fired oxynitride obtained by the firing is then heat treated under conditions in which Li is present. The obtained fired oxynitride is heat treated in an inert gas atmosphere or in a reducing gas atmosphere, in a temperature range of from 1450° C. to less than the aforementioned firing temperature, to obtain an oxynitride phosphor powder with a Li content of 50 to 10,000 ppm, and this can yield an oxynitride phosphor powder with particularly high external quantum efficiency when emitting fluorescence in a wavelength range with a peak wavelength of between 587 nm and 630 nm upon being excited by light with a wavelength of 450 nm.

The heat treatment under conditions in which Li is present may be a method of mixing a Li compound with the fired oxynitride intermediate and heat treating the mixture, a method of placing the Li compound beforehand in the crucible to be used for heat treatment, firing it in a temperature range of 1200 to 1600° C. and using the crucible for heat treatment of the fired oxynitride intermediate, or a method of simultaneously heat treating a crucible containing a fired oxynitride and a crucible containing a Li compound in an inert gas atmosphere or in a reducing gas atmosphere. The Li compound used may be lithium carbonate, lithium oxide, lithium nitride or the like, and any one of these powders may be used alone or they may be used in combination. For example, in a method of mixing $Li_2O$ as a Li compound with the fired oxynitride intermediate and heat treating the mixture, the amount of Li compound added is suitable at 0.4 g to 18.5 g with respect to 100 g of the fired oxynitride. Also, in a method of placing a Li compound beforehand in the crucible to be used for heat treatment, firing it in a temperature range of 1200 to 1600° C. and using the crucible for heat treatment of the fired oxynitride intermediate, the amount of Li compound is suitably 0.4 g to 18.5 g with respect to 100 g of the fired oxynitride.

In order to obtain an oxynitride phosphor powder with higher external quantum efficiency, the heat treatment temperature is preferably in the range of 1450 to 1600° C. The heat treatment temperature is more preferably 1500° C. or higher and even more preferably 1550° C. or higher. If the heat treatment temperature is not at least 1450° C., or if it exceeds 1600° C., the range of improvement in the external quantum efficiency of the obtained oxynitride phosphor powder will be reduced. The retention time at the maximum temperature during heat treatment is preferably 0.5 hour or longer, in order to obtain particularly high exterior quantum efficiency. Even if heat treatment is carried out for longer than 4 hours, either the increase in external quantum efficiency with the lengthening time will be only minimal, or there will be virtually no change, and therefore the retention time at the maximum temperature with heat treatment is preferably in the range of 0.5 to 4 hours.

There are no particular restrictions on the heating furnace used for heat treatment so long as it allows heat treatment in an inert gas atmosphere or in a reducing gas atmosphere, in a temperature range from 1450° C. to less than the aforementioned firing temperature. For example, a batch electric furnace employing a high-frequency induction heating system or a resistance heating system, or a rotary kiln, or a fluidized bed kiln, or a pusher electric furnace, or the like, may be used. As the crucible in which the mixture is to be filled there may be used a BN crucible, silicon nitride crucible, graphite crucible or silicon carbide crucible.

The oxynitride phosphor powder of the invention is a phosphor powder obtained by the production method described above, and more specifically, it is an oxynitride phosphor powder including Ca-containing α-SiAlON and aluminum nitride, and containing Li at 50 to 10,000 ppm, obtained by mixing silicon nitride powder, a substance serving as an aluminum source, a substance serving as a calcium source and a substance serving as an europium source, firing the mixture at 1500 to 2000° C. in an inert gas atmosphere or in a reducing gas atmosphere to obtain a fired oxynitride phosphor including Ca-containing α-SiAlON and aluminum nitride, as an intermediate, and then heat treating the fired oxynitride phosphor at a temperature of from 1450° C. to less than the firing temperature, in an inert gas atmosphere or in a reducing gas atmosphere under conditions in which Li is present.

EXAMPLES

Concrete examples will now be provided for a more detailed explanation of the invention.

Example 1

Silicon nitride, europium nitride, aluminum nitride and calcium nitride were weighed out in a nitrogen-purged glove box so that the design composition for oxynitride phosphor listed in Table 1 was obtained, and a dry vibrating mill was then used for mixing to obtain a mixed powder. The specific surface area, mean particle size and oxygen content of the silicon nitride powder were 0.3 $m^2$/g, 8.0 µm and 0.29 mass %, respectively. The obtained mixed powder was placed in a silicon nitride crucible and charged into a graphite resistance heating-type electric furnace, and after raising the temperature to 1725° C. while circulating nitrogen through the electric furnace and maintaining a state of ordinary pressure, it was held at 1725° C. for 12 hours to obtain a fired oxynitride.

The obtained fired oxynitride was shredded and the powder with a particle size of 5 to 20 µm was sorted out, $Li_2O$ powder (model number: LIO01PB by Kojundo Chemical Lab. Co., Ltd., purity: 2N up) was added in the amount listed in Table 1, so that the Li content was in the design composition listed in Table 2 with respect to 100 g of the obtained powder, and the components were mixed with a mortar. The mixed powder was placed in an alumina crucible and charged into a graphite resistance heating-type electric furnace, and after raising the temperature to 1550° C. while circulating nitrogen through the electric furnace and maintaining a state of ordinary pressure, it was held at 1550° C. for 1 hour to obtain an oxynitride phosphor powder.

The obtained oxynitride phosphor powder was subjected to XRD measurement. The oxynitride phosphor powder was composed of an α-SiAlON crystal phase and an aluminum nitride crystal phase. The contents were 94 mass % and 6 mass %, respectively.

The obtained oxynitride phosphor powder was further subjected to thermolysis with phosphoric acid, perchloric acid, nitric acid and hydrofluoric acid and brought to a constant volume with purified water, and the Li content of the obtained oxynitride phosphor powder was measured by ICP-AES analysis (measuring apparatus: Model SPS5100 by SII NanoTechnology Inc.). The Li content of the oxynitride phosphor powder was 241 ppm. The obtained oxynitride phosphor powder was further subjected to acid treatment by 5 hours of immersion in 1N nitric acid (1N nitric acid in 50-fold amount by mass with respect to phosphor powder) at 20° C., filtration and purified water rinsing, to remove the surface layer of the oxynitride phosphor, and then the surface layer-removed phosphor was subjected to ICP-AES quantitative analysis in the same manner to measure the intraparticle Li content. Based on the difference in the total Li contents, the surface Li content ratio was calculated by the following formula (1):

((Total Li content−intraparticle Li content)/total Li content)×100   formula (1).

In addition, in order to evaluate the fluorescent property of the obtained oxynitride phosphor powder, a solid quantum efficiency measuring device incorporating an integrating sphere in an FP-6500 by JASCO Corp. was used to measure the fluorescence spectrum at an excitation wavelength of 450 nm, and simultaneously measure the absorptivity and the internal quantum efficiency. From the obtained fluorescence spectrum the fluorescence peak wavelength and the luminous intensity at that wavelength were derived, and the external quantum efficiency was calculated from the absorptivity and internal quantum efficiency. The relative fluorescence intensity, as an index of brightness, was the relative value of the luminous intensity at the fluorescence peak wavelength, where 100% was defined as the value of the maximum intensity in the fluorescence spectrum at the same excitation wavelength as a commercially available YAG:Ce phosphor (P46Y3 by Kasei Optonics). Table 2 shows the evaluation results for the fluorescent property of the oxynitride phosphor powder of Example 1, the Li contents and surface Li contents based on ICP analysis, and the produced crystal phases of the oxynitride phosphor powders based on XRD analysis, along with their contents.

TABLE 1

| | X1 | X2 | Y | Z | X1 + x2 | X2/x1 | Li$_2$O addition amount*1 [g] | Heat treatment temperature [° C.] |
|---|---|---|---|---|---|---|---|---|
| Example 1 | 2.00 | 0.20 | 4.6 | 0.0 | 2.20 | 0.100 | 0.45 | 1550 |
| Example 2 | 2.00 | 0.20 | 4.6 | 0.0 | 2.20 | 0.100 | 1.35 | 1550 |
| Example 3 | 2.00 | 0.20 | 4.6 | 0.0 | 2.20 | 0.100 | 2.03 | 1550 |
| Example 4 | 2.00 | 0.20 | 4.6 | 0.0 | 2.20 | 0.100 | 3.86 | 1550 |
| Example 5 | 0.95 | 0.90 | 4.6 | 0.0 | 1.85 | 0.950 | 2.96 | 1550 |
| Example 6 | 0.95 | 0.90 | 4.6 | 0.0 | 1.85 | 0.950 | 6.08 | 1550 |
| Example 7 | 0.95 | 0.90 | 4.6 | 0.0 | 1.85 | 0.950 | 9.47 | 1550 |
| Example 8 | 0.95 | 0.90 | 4.6 | 0.0 | 1.85 | 0.950 | 15.45 | 1550 |
| Example 9 | 0.95 | 0.90 | 4.6 | 0.0 | 1.85 | 0.950 | 18.45 | 1550 |
| Example 10 | 1.57 | 0.29 | 4.0 | 0.0 | 1.86 | 0.182 | 2.03 | 1550 |
| Example 11 | 1.35 | 0.44 | 4.0 | 0.0 | 1.78 | 0.323 | 2.03 | 1550 |
| Example 12 | 1.03 | 0.65 | 4.0 | 0.0 | 1.68 | 0.633 | 2.03 | 1550 |
| Example 13 | 2.27 | 0.02 | 4.6 | 0.0 | 2.29 | 0.010 | 2.03 | 1550 |
| Example 14 | 1.81 | 0.33 | 4.6 | 0.0 | 2.14 | 0.182 | 2.03 | 1550 |
| Example 15 | 1.55 | 0.50 | 4.6 | 0.0 | 2.05 | 0.323 | 2.03 | 1550 |
| Example 16 | 1.18 | 0.75 | 4.6 | 0.0 | 1.93 | 0.633 | 2.03 | 1550 |
| Example 17 | 0.84 | 0.97 | 4.6 | 0.0 | 1.81 | 1.15 | 2.03 | 1550 |
| Example 18 | 0.71 | 1.06 | 4.6 | 0.0 | 1.77 | 1.50 | 2.03 | 1550 |
| Example 19 | 2.16 | 0.39 | 5.5 | 0.0 | 2.55 | 0.182 | 2.03 | 1550 |
| Example 20 | 2.02 | 0.65 | 6.0 | 0.0 | 2.67 | 0.323 | 2.03 | 1550 |
| Example 21 | 1.80 | 1.14 | 7.0 | 0.0 | 2.93 | 0.633 | 2.03 | 1550 |
| Example 22 | 2.83 | 0.52 | 7.3 | 0.0 | 3.34 | 0.182 | 2.03 | 1550 |
| Example 23 | 1.81 | 0.33 | 4.6 | 0.2 | 2.14 | 0.182 | 2.03 | 1550 |
| Example 24 | 1.81 | 0.33 | 4.6 | 0.5 | 2.14 | 0.182 | 2.03 | 1550 |
| Example 25 | 1.81 | 0.33 | 4.6 | 1.0 | 2.14 | 0.182 | 2.03 | 1550 |
| Example 26 | 1.81 | 0.33 | 4.6 | 1.1 | 2.14 | 0.182 | 2.03 | 1550 |
| Example 27 | 1.81 | 0.33 | 4.6 | 1.5 | 2.14 | 0.182 | 2.03 | 1550 |
| Ref. Ex. 1 | 0.94 | 0.17 | 2.4 | 0.0 | 1.11 | 0.182 | 2.03 | 1550 |
| Ref. Ex. 2 | 1.02 | 0.19 | 2.6 | 0.0 | 1.21 | 0.182 | 2.03 | 1550 |
| Ref. Ex. 3 | 1.41 | 0.26 | 3.6 | 0.0 | 1.67 | 0.182 | 2.03 | 1550 |
| Comp. Ex. 1 | 0.95 | 0.90 | 4.6 | 0.0 | 1.85 | 0.95 | 0.00 | 1550 |
| Comp. Ex. 2 | 0.95 | 0.90 | 4.6 | 0.0 | 1.85 | 0.95 | 0.10 | 1550 |
| Comp. Ex. 3 | 0.95 | 0.90 | 4.6 | 0.0 | 1.85 | 0.95 | 21.31 | 1550 |
| Comp. Ex. 4* | 0.70 | 0.10 | 1.0 | 0.3 | 0.80 | 0.143 | 2.03 | 1550 |
| Comp. Ex. 5* | 2.89 | 0.42 | 4.2 | 0.6 | 3.31 | 0.144 | 2.03 | 1550 |
| Comp. Ex. 6* | 2.89 | 0.42 | 4.2 | 0.6 | 3.31 | 0.144 | — | — |
| Comp. Ex. 7* | 2.89 | 0.42 | 4.2 | 0.6 | 3.31 | 0.144 | 0.00 | 1550 |
| Comp. Ex. 8 | 1.81 | 0.33 | 4.6 | 0.0 | 2.14 | 0.182 | 2.03 | 1725 |
| Comp. Ex. 9 | 1.81 | 0.33 | 4.6 | 0.0 | 2.14 | 0.182 | 2.03 | 1750 |
| Comp. Ex. 10 | 1.81 | 0.33 | 4.6 | 0.0 | 2.14 | 0.182 | 2.03 | 1400 |

*Li$_{x1}$Eu$_{x2}$Si$_{12-(y+z)}$Al$_{(y+z)}$O$_z$N$_{16-z}$
*1Li$_2$O addition amount with respect to 100 g of fired oxynitride

TABLE 2

| | Crystal phase | Crystal phase content [mass %] α-type SiAlON | Crystal phase content [mass %] AlN | Li content [ppm] | Intraparticle Li content*2 [ppm] | Surface Li content [%] | Peak wavelength [nm] | Relative luminous intensity [%] | Absorptivity [%] | External quantum efficiency [%] | Internal quantum efficiency [%] |
|---|---|---|---|---|---|---|---|---|---|---|---|
| Example 1 | α-SiAlON + AlN | 94 | 6 | 241 | 84 | 65 | 605.5 | 228 | 86.0 | 70.2 | 81.6 |
| Example 2 | α-SiAlON + AlN | 93 | 7 | 689 | 193 | 72 | 606.0 | 232 | 86.3 | 71.4 | 82.7 |
| Example 3 | α-SiAlON + AlN | 94 | 6 | 1012 | 293 | 71 | 607.0 | 229 | 87.0 | 70.5 | 81.0 |
| Example 4 | α-SiAlON + AlN | 94 | 6 | 2054 | 719 | 65 | 606.5 | 225 | 86.6 | 69.2 | 79.9 |
| Example 5 | α-SiAlON + AlN | 97 | 3 | 1535 | 568 | 63 | 621.0 | 188 | 89.6 | 57.9 | 64.6 |
| Example 6 | α-SiAlON + AlN | 95 | 5 | 3135 | 1129 | 64 | 622.0 | 176 | 89.9 | 54.5 | 60.6 |
| Example 7 | α-SiAlON + AlN | 96 | 4 | 4911 | 1915 | 61 | 621.0 | 169 | 89.4 | 52.3 | 58.5 |
| Example 8 | α-SiAlON + AlN | 96 | 4 | 8012 | 2323 | 71 | 620.5 | 164 | 89.7 | 50.6 | 56.4 |
| Example 9 | α-SiAlON + AlN | 95 | 5 | 9870 | 3455 | 65 | 621.0 | 161 | 89.9 | 50.5 | 56.2 |
| Example 10 | α-SiAlON + AlN | 98 | 2 | 1058 | 391 | 63 | 610.5 | 194 | 87.1 | 59.7 | 68.5 |
| Example 11 | α-SiAlON + AlN | 95 | 5 | 997 | 279 | 72 | 612.0 | 189 | 86.0 | 58.2 | 67.7 |
| Example 12 | α-SiAlON + AlN | 93 | 7 | 1022 | 307 | 70 | 617.0 | 175 | 88.1 | 54.2 | 61.5 |
| Example 13 | α-SiAlON + AlN | 90 | 10 | 1015 | 315 | 69 | 597.5 | 152 | 74.4 | 47.1 | 63.3 |
| Example 14 | α-SiAlON + AlN | 92 | 8 | 1082 | 335 | 69 | 611.5 | 205 | 86.8 | 63.1 | 72.7 |
| Example 15 | α-SiAlON + AlN | 91 | 9 | 1006 | 292 | 71 | 613.5 | 197 | 87.9 | 61.1 | 69.5 |
| Example 16 | α-SiAlON + AlN | 89 | 11 | 1032 | 361 | 65 | 618.0 | 186 | 88.2 | 57.2 | 64.9 |
| Example 17 | α-SiAlON + AlN | 86 | 14 | 1029 | 370 | 64 | 626.0 | 163 | 88.9 | 50.3 | 56.6 |
| Example 18 | α-SiAlON + AlN | 87 | 13 | 1001 | 350 | 65 | 629.0 | 149 | 89.9 | 46.5 | 51.7 |
| Example 19 | α-SiAlON + AlN | 77 | 23 | 995 | 328 | 67 | 612.5 | 228 | 86.7 | 70.2 | 81.0 |
| Example 20 | α-SiAlON + AlN | 67 | 33 | 986 | 335 | 66 | 615.0 | 195 | 87.7 | 60.0 | 68.4 |
| Example 21 | α-SiAlON + AlN | 64 | 36 | 1021 | 368 | 64 | 619.5 | 164 | 88.9 | 50.9 | 57.3 |
| Example 22 | α-SiAlON + AlN | 62 | 38 | 1016 | 396 | 61 | 625.5 | 147 | 89.2 | 45.3 | 50.8 |
| Example 23 | α-SiAlON + AlN | 92 | 8 | 1008 | 312 | 69 | 609.0 | 183 | 89.7 | 56.8 | 63.3 |
| Example 24 | α-SiAlON + AlN | 89 | 11 | 993 | 328 | 67 | 605.5 | 169 | 88.7 | 51.7 | 58.3 |
| Example 25 | α-SiAlON + AlN | 86 | 14 | 1026 | 369 | 64 | 599.0 | 150 | 88.2 | 46.2 | 52.4 |
| Example 26 | α-SiAlON + AlN | 88 | 12 | 1025 | 379 | 63 | 589.5 | 146 | 83.4 | 45.9 | 55.0 |
| Example 27 | α-SiAlON + AlN | 87 | 13 | 1033 | 310 | 70 | 587.0 | 143 | 81.9 | 44.5 | 54.3 |
| Ref. Ex. 1 | α-SiAlON | 100 | — | 996 | 298 | 70 | 603.0 | 168 | 82.9 | 51.6 | 62.2 |
| Ref. Ex. 2 | α-SiAlON | 100 | — | 1001 | 310 | 69 | 602.5 | 186 | 84.4 | 57.0 | 67.5 |
| Ref. Ex. 3 | α-SiAlON | 100 | — | 987 | 365 | 63 | 604.5 | 168 | 51.7 | 49.5 | 95.7 |
| Comp. Ex. 1 | α-SiAlON + AlN | 95 | 5 | <10 | <10 | — | 613.5 | 66 | 88.5 | 30.4 | 34.4 |
| Comp. Ex. 2 | α-SiAlON + AlN | 94 | 6 | 39 | <10 | — | 616.5 | 108 | 88.3 | 34.8 | 39.4 |
| Comp. Ex. 3 | α-SiAlON + AlN | 96 | 4 | 10760 | 3874 | 64 | 620.5 | 103 | 88.9 | 32.9 | 37.0 |
| Comp. Ex. 4* | α-SiAlON | 100 | — | 10400 | 9048 | 13 | 591.0 | 132 | 77.1 | 42.5 | 55.1 |
| Comp. Ex. 5* | α-SiAlON | 100 | — | 20039 | 17835 | 11 | 585.0 | 56 | 72.4 | 25.7 | 35.5 |
| Comp. Ex. 6* | α-SiAlON | 100 | — | 15029 | 13676 | 9 | 584.5 | 37 | 72.0 | 18.1 | 25.1 |
| Comp. Ex. 7* | α-SiAlON | 100 | — | 13025 | 11983 | 8 | 582.0 | 35 | 66.2 | 17.4 | 26.3 |
| Comp. Ex. 8 | α-SiAlON + AlN | 98 | 2 | 528 | 277 | 48 | 607.0 | 133 | 84.8 | 40.1 | 47.3 |
| Comp. Ex. 9 | α-SiAlON + AlN | 98 | 2 | 259 | 185 | 29 | 603.5 | 127 | 83.6 | 39.9 | 47.7 |
| Comp. Ex. 10 | α-SiAlON + AlN | 87 | 13 | 45 | 11 | 76 | 612.0 | 129 | 85.9 | 42.7 | 49.7 |

*$Li_{x1}Eu_{x2}Si_{12-(y+z)}Al_{(y+z)}O_zN_{16-z}$
*2 Li content after etching treatment Examples 2 to 4

Oxynitride phosphor powders were obtained by the same method as Example 1, except that the Li$_2$O powder added during heat treatment was added in the amounts shown in Table 1. The fluorescent properties of the obtained oxynitride phosphor powder, as well as the Li contents and surface Li contents, and the produced crystal phases and their contents, were measured by the same method as in Example 1. The results are shown in Table 2.

Examples 5 to 9

Oxynitride phosphor powders were obtained by the same method as Example 1, except that silicon nitride, europium nitride, aluminum nitride and calcium nitride were weighed out and mixed as starting powders so that the oxynitride phosphor powders had the design compositions listed in Table 1, and the Li$_2$O powder added during heat treatment was added in the amounts shown in Table 1. The fluorescent properties of the obtained oxynitride phosphor powders, as well as the Li contents and surface Li contents, and the produced crystal phases and their contents, were measured by the same method as in Example 1. The results are shown in Table 2.

Examples 10 to 27

Oxynitride phosphor powders were obtained by the same method as Example 3, except that silicon nitride, aluminum nitride, aluminum oxide, calcium nitride, calcium carbonate, europium nitride and europium oxide were used as starting powders so that the oxynitride phosphor powders had the design compositions listed in Table 1. The fluorescent properties of the obtained oxynitride phosphor powders, as well as the Li contents and surface Li contents, and the produced crystal phases and their contents, were measured by the same method as in Example 1. The results are shown in Table 2.

It is seen that oxynitride phosphor powders in the ranges of $1.60 \leq x1+x2 \leq 3.00$, $0.10 \leq x2/x1 \leq 1.20$, $4.0 \leq y \leq 7.0$, $0 \leq z \leq 0.5$ in the aforementioned general formula, as in Examples 1 to 12, 14 to 17, 19 to 21, 23 and 24, exhibited marked improvement in fluorescence intensity by the effect of adding Li$_2$O during the heat treatment, and a large external quantum efficiency of 50% or greater was obtained in the luminescence peak wavelength range of 605 to 626 nm.

Reference Examples 1 to 3

Oxynitride phosphor powders were obtained by the same method as Example 3, except that silicon nitride, aluminum nitride, calcium nitride and europium nitride were used as starting powders so that the oxynitride phosphor powders had the design compositions listed in Table 1. The fluorescent properties of the obtained oxynitride phosphor powders, as well as the Li contents and surface Li contents, and the produced crystal phases and their contents, were measured by the same method as in Example 1. The results are shown in Table 2.

Comparative Example 1

Oxynitride phosphor powder was obtained by the same method as Example 5, except that no $Li_2O$ was added during the heat treatment. The fluorescent properties of the obtained oxynitride phosphor powder, and the produced crystal phase and its content, were measured by the same method as in Example 1. The results are shown in Table 2. The fluorescence spectra for Example 5 and Comparative Example 1 are shown in FIG. 1. It is seen that the fluorescence intensity for Example 5, in which $Li_2O$ was added during the heat treatment, was higher than the fluorescence intensity for Comparative Example 1.

Comparative Examples 2 and 3

Oxynitride phosphor powders were obtained by the same method as Example 5, except that silicon nitride, europium nitride, aluminum nitride and calcium nitride were weighed out and mixed as starting powders so that the oxynitride phosphor powders had the design compositions listed in Table 1, and the $Li_2O$ powder added during heat treatment was added in the amounts shown in Table 1. The fluorescent properties of the obtained oxynitride phosphor powders, and the produced crystal phases and their contents, were measured by the same method as in Example 1. The results are shown in Table 2. In Comparative Example 2, the amount of $Li_2O$ added during heat treatment was low at 0.10 g, resulting in a Li content of less than 50 ppm in the oxynitride phosphor powder, and therefore the relative fluorescence intensity was low. In Comparative Example 3, the amount of $Li_2O$ added during heat treatment was high at 21.31 g, resulting in a Li content of greater than 10,000 ppm in the oxynitride phosphor powder, and therefore the relative fluorescence intensity was low.

Comparative Example 4

Silicon nitride, aluminum nitride, aluminum oxide, lithium carbonate and europium oxide were used and weighed out in a nitrogen-purged glove box in amounts such that x1=0.7, x2=0.10, y=1.0, and z=0.3 in the compositional formula $Li_{x1}Eu_{x2}Si_{12-(y+z)}Al_{(y+z)}O_{16-z}$, and a dry vibrating mill was used for mixing to obtain a mixed powder. The specific surface area, mean particle size and oxygen content of the silicon nitride powder were 0.3 m²/g, 8.0 μm and 0.29 mass %, respectively. The obtained mixed powder was placed in a silicon nitride crucible and charged into a graphite resistance heating-type electric furnace, and after raising the temperature to 1725° C. while circulating nitrogen through the electric furnace and maintaining a state of ordinary pressure, it was held at 1725° C. for 12 hours for a first firing to obtain a fired oxynitride.

The obtained fired oxynitride was shredded and classified to obtain powder with a particle size of 5 to 20 μm, and then $Li_2O$ was added at 2.03 g with respect to 100 g of the obtained fired oxynitride, and the components were mixed with a mortar. The mixed powder was placed in an alumina crucible and charged into a graphite resistance heating-type electric furnace, and after raising the temperature to 1550° C. while circulating nitrogen through the electric furnace and maintaining a state of ordinary pressure, it was held at 1550° C. for 1 hour to obtain an oxynitride phosphor powder for Comparative Example 4. The fluorescent properties of the obtained oxynitride phosphor powder, and the produced crystal phase and its content, as well as the Li content and surface Li content, were measured by the same method as in Example 1. The results are shown in Table 2. It is seen that the oxynitride phosphor powder of Comparative Example 4 had low external quantum efficiency.

Comparative Example 5

Oxynitride phosphor powder was obtained by the same method as Comparative Example 4, except that silicon nitride, aluminum nitride, aluminum oxide, lithium carbonate and europium oxide were weighed out and mixed in amounts such that x1=2.89, x2=0.42, y=4.2, and z=0.6 in the compositional formula $Li_{x1}Eu_{x2}Si_{12-(y+z)}Al_{(y+z)}O_{16-z}$. The fluorescent properties of the obtained oxynitride phosphor powder, as well as the Li content and surface Li content, and the produced crystal phase and its content, were measured by the same method as in Comparative Example 4. The results are shown in Table 2. It is seen that the oxynitride phosphor powder of Comparative Example 5 had low external quantum efficiency.

Comparative Example 6

Oxynitride phosphor powder was obtained under the same conditions as Comparative Example 5, except that no heat treatment in the presence of Li was conducted after the obtained fired oxynitride was shredded and classified to obtain powder with a particle size of 5 to 20 μm. The fluorescent properties of the obtained oxynitride phosphor powder, as well as the Li content and surface Li content, and the produced crystal phase and its content, were measured by the same method as in Comparative Example 4. The results are shown in Table 2. It is seen that the oxynitride phosphor powder of Comparative Example 6 had low external quantum efficiency.

Comparative Example 7

Oxynitride phosphor powder was obtained under the same conditions as Comparative Example 5, except that heat treatment was carried out without addition of $Li_2O$. The fluorescent properties of the obtained oxynitride phosphor powder, as well as the Li content and surface Li content, and the produced crystal phase and its content, were measured by the same method as in Comparative Example 4. The results are shown in Table 2. It is seen that the oxynitride phosphor powder of Comparative Example 7 had low external quantum efficiency.

Comparative Example 8

Oxynitride phosphor powder was obtained by the same method as Example 14, except that the heat treatment conditions were 1725° C. for 1 hour. The fluorescent properties of the obtained oxynitride phosphor powder, as well as the Li content and surface Li content, and the produced crystal phase and its content, were measured by the same method as in Example 1. The results are shown in Table 2.

Comparative Example 9

Oxynitride phosphor powder was obtained by the same method as Example 14, except that the heat treatment conditions were 1750° C. for 1 hour. The fluorescent properties of the obtained oxynitride phosphor powder, as well as the Li content and surface Li content, and the produced crystal phase and its content, were measured by the same method as in Example 1. The results are shown in Table 2. In Comparative Examples 8 and 9, in which heat treatment was conducted at a temperature equal to or higher than the firing temperature for the oxynitride phosphor powder, the surface Li contents were lower, the luminescence peak wavelengths were lower, and the external quantum efficiencies were reduced, compared to Example 14.

Comparative Example 10

Oxynitride phosphor powder was obtained by the same method as Example 14, except that the heat treatment conditions were 1400° C. for 1 hour. The fluorescent properties of the obtained oxynitride phosphor powder, as well as the Li content and surface Li content, and the produced crystal phase and its content, were measured by the same method as in Example 1. The results are shown in Table 2. It is seen that the external quantum efficiency was low.

What is claimed is:

1. A method of producing an oxynitride phosphor powder containing Li at 50 to 10,000 ppm, comprising:
   mixing silicon nitride powder, a substance serving as an aluminum source, a substance serving as a calcium source and a substance serving as an europium source to form a mixture;
   firing the mixture at 1500 to 2000° C. in an inert gas atmosphere or in a reducing gas atmosphere to obtain a fired oxynitride phosphor composed mainly of Ca-containing α-SiAlON not containing Li, as an intermediate; and
   heat treating the fired oxynitride phosphor at a temperature of 1450° C. to less than the firing temperature, in an inert gas atmosphere or in a reducing gas atmosphere in the presence of Li.

2. An oxynitride phosphor powder obtained by mixing silicon nitride powder, a substance serving as an aluminum source, a substance serving as a calcium source and a substance serving as an europium source to form a mixture, firing the mixture at 1500 to 2000° C. in an inert gas atmosphere or in a reducing gas atmosphere to obtain a fired oxynitride phosphor composed mainly of Ca-containing α-SiAlON not containing Li, as an intermediate, and heat treating the fired oxynitride phosphor at a temperature of 1450° C. to less than the firing temperature, in an inert gas atmosphere or in a reducing gas atmosphere in the presence of Li, the powder containing 50 to 10,000 ppm of Li and having a surface Li content of 50% or greater.

3. An oxynitride phosphor powder comprising Ca-containing α-SiAlON and aluminum nitride, and 50 to 10,000 ppm of Li and having a surface Li content of 50% or greater.

4. The oxynitride phosphor powder according to claim 3, wherein a compositional formula of the Ca-containing α-SiAlON and aluminum nitride is as follows:

$$Ca_{x1}Eu_{x2}Si_{12-(y+z)}Al_{(y+z)}O_zN_{16-z}$$

wherein $1.60 \leq x1+x2 \leq 3.00$, $0.10 \leq x2/x1 \leq 1.20$, $4.0 \leq y \leq 7.0$, $0 \leq z \leq 0.5$.

5. The oxynitride phosphor powder according to claim 4, wherein the aluminum nitride content is greater than 0 mass % and less than 36 mass %.

6. The oxynitride phosphor powder according to claim 4, wherein excitation with light having a wavelength of 450 nm causes emission of fluorescence with a peak wavelength in a wavelength range of 605 nm to 630 nm, an external quantum efficiency thereof being 50% or greater.

7. The oxynitride phosphor powder according to claim 3, wherein the aluminum nitride content is greater than 0 mass % and less than 36 mass %.

8. The oxynitride phosphor powder according to claim 7, wherein excitation with light having a wavelength of 450 nm causes emission of fluorescence with a peak wavelength in a wavelength range of 605 nm to 630 nm, an external quantum efficiency thereof being 50% or greater.

9. The oxynitride phosphor powder according to claim 3, wherein excitation with light having a wavelength of 450 nm causes emission of fluorescence with a peak wavelength in a wavelength range of 605 nm to 630 nm, an external quantum efficiency thereof being 50% or greater.

10. An oxynitride phosphor powder obtained by mixing silicon nitride powder, a substance serving as an aluminum source, a substance serving as a calcium source and a substance serving as an europium source to form a mixture, firing the mixture at 1500 to 2000° C. in an inert gas atmosphere or in a reducing gas atmosphere to obtain a fired oxynitride phosphor comprising Ca-containing α-SiAlON not containing Li and aluminum nitride, as an intermediate, and heat treating the fired oxynitride phosphor at a temperature of 1450° C. to less than the firing temperature, in an inert gas atmosphere or in a reducing gas atmosphere in the presence of Li, the powder containing 50 to 10,000 ppm of Li and having a surface Li content of 50% or greater.

11. A light-emitting device employing the oxynitride phosphor powder according to claim 10.

12. A light-emitting device employing the oxynitride phosphor powder according to claim 3.

13. A light-emitting device employing the oxynitride phosphor powder according to claim 4.

14. A light-emitting device employing the oxynitride phosphor powder according to claim 7.

15. A light-emitting device employing the oxynitride phosphor powder according to claim 9.

16. A light-emitting device employing the oxynitride phosphor powder according to claim 10.

* * * * *

UNITED STATES PATENT AND TRADEMARK OFFICE
CERTIFICATE OF CORRECTION

PATENT NO. : 10,125,313 B2
APPLICATION NO. : 15/115943
DATED : November 13, 2018
INVENTOR(S) : Sumino et al.

Page 1 of 1

It is certified that error appears in the above-identified patent and that said Letters Patent is hereby corrected as shown below:

In the Claims

<u>Claim 11</u>
In Column 20, at Line 48, please change "claim 10" to --claim 2--.

Signed and Sealed this
Eighth Day of January, 2019

Andrei Iancu
*Director of the United States Patent and Trademark Office*